United States Patent [19]

Taylor et al.

[11] Patent Number: 5,065,334

[45] Date of Patent: Nov. 12, 1991

[54] METHOD AND APPARATUS FOR DISTINGUISHING NARROWBAND CONTINUOUS WAVE SIGNALS FROM BROADBAND AND IMPULSIVE SIGNALS

[75] Inventors: John B. Taylor, Santa Rosa; Michael K. Ellis, Rohnert Park, both of Calif.

[73] Assignee: Hewlett-Packard Company, Palo Alto, Calif.

[21] Appl. No.: 345,601

[22] Filed: Apr. 28, 1989

[51] Int. Cl.[5] .................. G01R 23/16; G06F 15/20
[52] U.S. Cl. .................. 364/485; 324/77 B; 364/487; 364/572
[58] Field of Search ............ 364/484, 485, 486, 487, 364/572, 574; 324/77 B, 77 R, 77 G, 78 F; 455/115; 381/46, 47; 382/34; 358/36

[56] References Cited

U.S. PATENT DOCUMENTS

| | | | |
|---|---|---|---|
| 4,253,152 | 2/1981 | Holdaway | 324/77 B |
| 4,607,216 | 8/1986 | Yamaguchi et al. | 324/77 B |
| 4,665,494 | 5/1987 | Tanaka et al. | 324/77 B |
| 4,794,324 | 12/1988 | Tracey et al. | 324/77 B |
| 4,797,941 | 1/1989 | Lloyd et al. | 382/34 |
| 4,802,231 | 1/1989 | Davis | 382/34 |
| 4,818,949 | 4/1989 | Cohen | 324/77 B |
| 4,839,582 | 6/1989 | Fukaya et al. | 324/77 B |
| 4,859,933 | 8/1989 | Taylor et al. | 324/77 B |
| 4,899,289 | 2/1990 | Appel | 324/77 G |

*Primary Examiner*—Kevin J. Teska
*Attorney, Agent, or Firm*—William C. Milks, III

[57] ABSTRACT

Received signals preferably have a stable frequency spectrum over a frequency span derived from a resolution bandpass filter. Furthermore, the frequency span has a plurality of discrete frequency measurements across the frequency span. It is desired to determine which of the discrete frequencies correspond to peaks in the frequency spectrum. Each peak is integrated to initially determine which of the peaks are from narrowband continuous wave signals by comparing the aspect ratio of the peaks with the aspect ratio of a resolution bandpass filter. Those peaks which fail the aspect ratio test are discarded from the frequency spectrum. The remaining peaks are then fitted to a second order polynomial curve to finally determine whether they are due to narrowband continuous wave signals. The peaks which do not fit the curve are labeled as broadband.

34 Claims, 4 Drawing Sheets

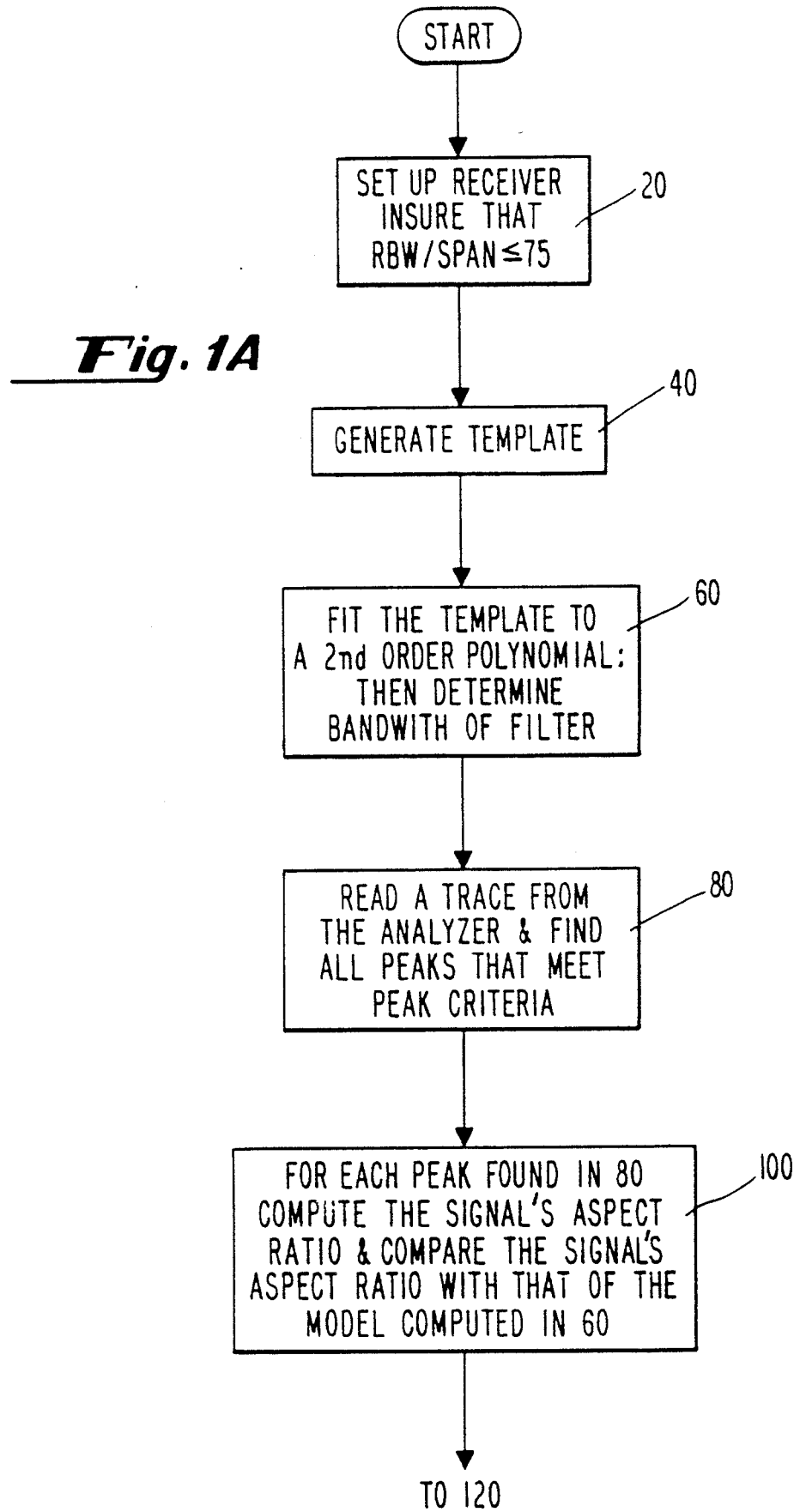

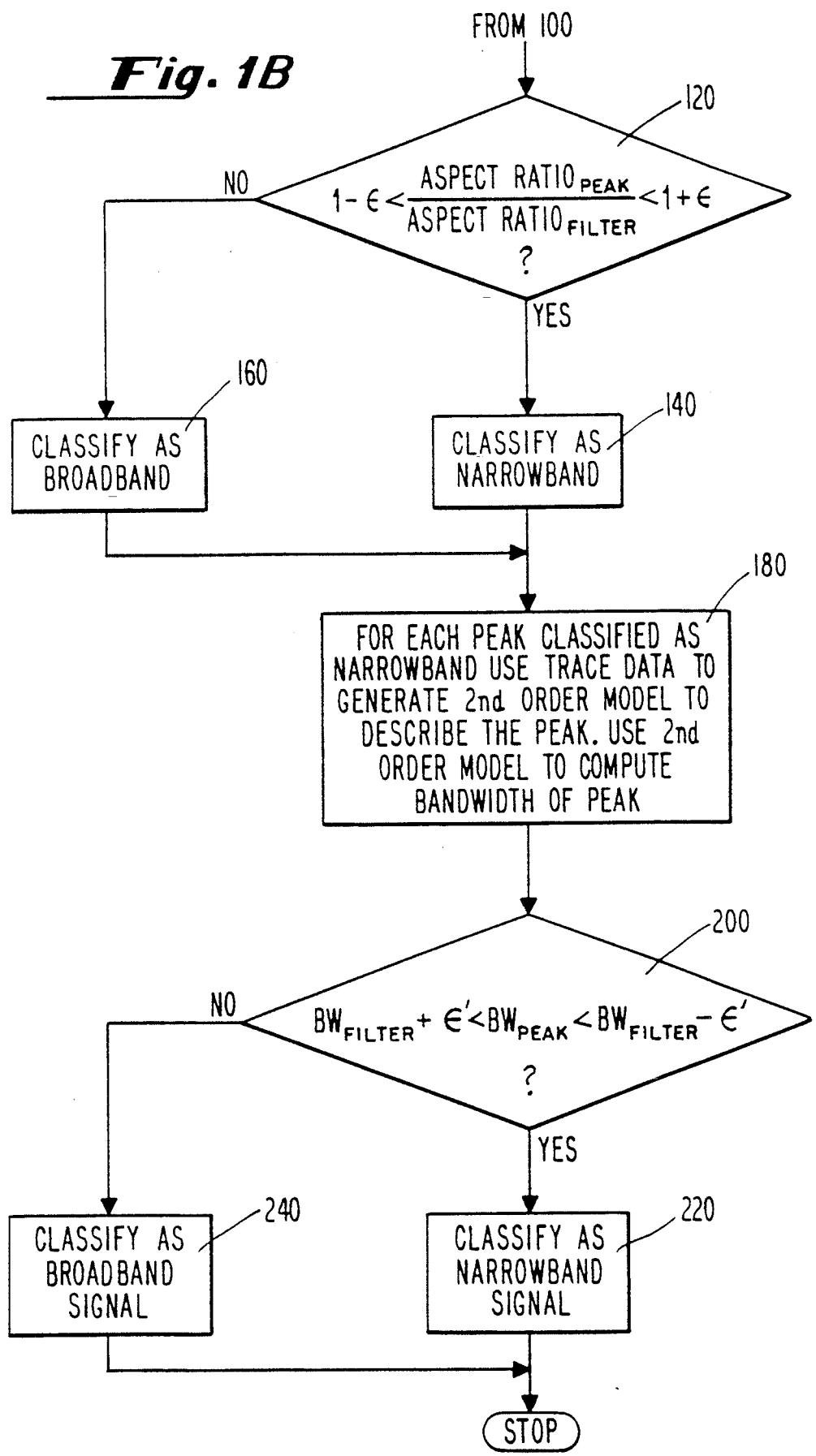

METHOD AND APPARATUS FOR DISTINGUISHING NARROWBAND CONTINUOUS WAVE SIGNALS FROM BROADBAND AND IMPULSIVE SIGNALS

FIELD OF THE INVENTION

This invention relates to methods and apparatus for electromagnetic signal measuring instrumentation. More specifically, this invention is directed to methods and apparatus for distinguishing narrowband continuous wave signals from broadband and impulsive signals.

BACKGROUND OF THE INVENTION

Equipment under test (EUT) may contribute to ambient noise picked up by the measuring receiver used for electromagnetic interference (EMI) tests. For example, EUTs containing switching power supplies which generate fast rise time pulses often produce broadband emissions.

Prior EMI measurement systems cannot discriminate between narrowband signals and broadband or impulsive noise. Specifically, as a measuring receiver in the form of a spectrum analyzer is swept across a frequency range to measure signals, signals appear at various spectral locations in the frequency spectrum. However, due to complexities in the EUT emissions, the frequency of the signal transmission can vary. Also, the spectrum analyzer can produce measurement errors.

Known methods of determining narrowband signals from broadband signals employ "template matching." Template matching is generally employed in pattern recognition systems, such as those exemplified in U.S. Pat. No. 4,802,231, Davis. The template matching and pattern recognition systems disclosed in Davis attempt to reduce error by creating independent error templates corresponding to patterns which tend to be erroneously matched and linked error templates which are linked to specified reference templates stored for comparison. Upon comparing an unknown pattern with the reference templates, independent error templates, and the linked error templates, the unknown pattern may be identified as a match whenever its test template is most closely matched to a reference template.

Additional methods of pattern recognition and pattern detection using template matching methods are disclosed in U.S. Pat. No. 4,797,941, Lloyd et al. The Lloyd et al. reference discloses comparing an input word to a word stored in template storage means such that if all the inputs are "one," the pattern features defined by a signal distribution correspond to a template word and detection of the pattern is accomplished. The procedure is repeated along an indexed address register to extract a succession of template words until detection is achieved.

Neither the Lloyd et al. nor the Davis patent describes methods, apparatus, or systems which solve a long-felt need in the art for fast and efficient pattern recognition. The Lloyd et al. and the Davis patents also do not provide methods, systems, or apparatus for reducing the time it takes an operator to distinguish narrowband continuous wave signals from broadband emissions or impulsive noise in an EMI test measurement system. This need exists in the art and has not been fulfilled by any of the methods, apparatus, or systems heretofore described.

SUMMARY OF THE INVENTION

Accordingly, methods of distinguishing narrowband continuous wave signals from broadband and impulsive signals provided in accordance with this invention solve a long-felt need in the art for methods of pattern recognition. Preferably, the narrowband continuous wave signals have a stable frequency spectrum over a frequency span derived from a resolution bandpass filter. More preferably, the frequency span has a plurality of discrete frequencies.

In preferred embodiments, the method comprises integrating each peak to determine which of the peaks are from narrowband continuous wave signals and discarding those peaks from the frequency spectrum determined not to be from narrowband continuous wave signals.

Systems for distinguishing narrowband continuous wave signals from broadband and impulsive signals are also provided in accordance with this invention. Preferably, receiving means for obtaining a frequency spectrum of the narrowband continuous wave and broadband and impulsive signals are provided. It is generally desired to provide integrator means operatively coupled to the receiver means for determining whether the peaks in the frequency spectrum initially correspond to narrowband continuous wave signals.

BRIEF DESCRIPTION ON THE DRAWINGS

FIGS. 1A-1B are a flow chart illustrating a preferred embodiment of methods provided in accordance with this invention.

DETAILED DESCRIPTION OF PREFERRED EMBODIMENTS

Figure 2:
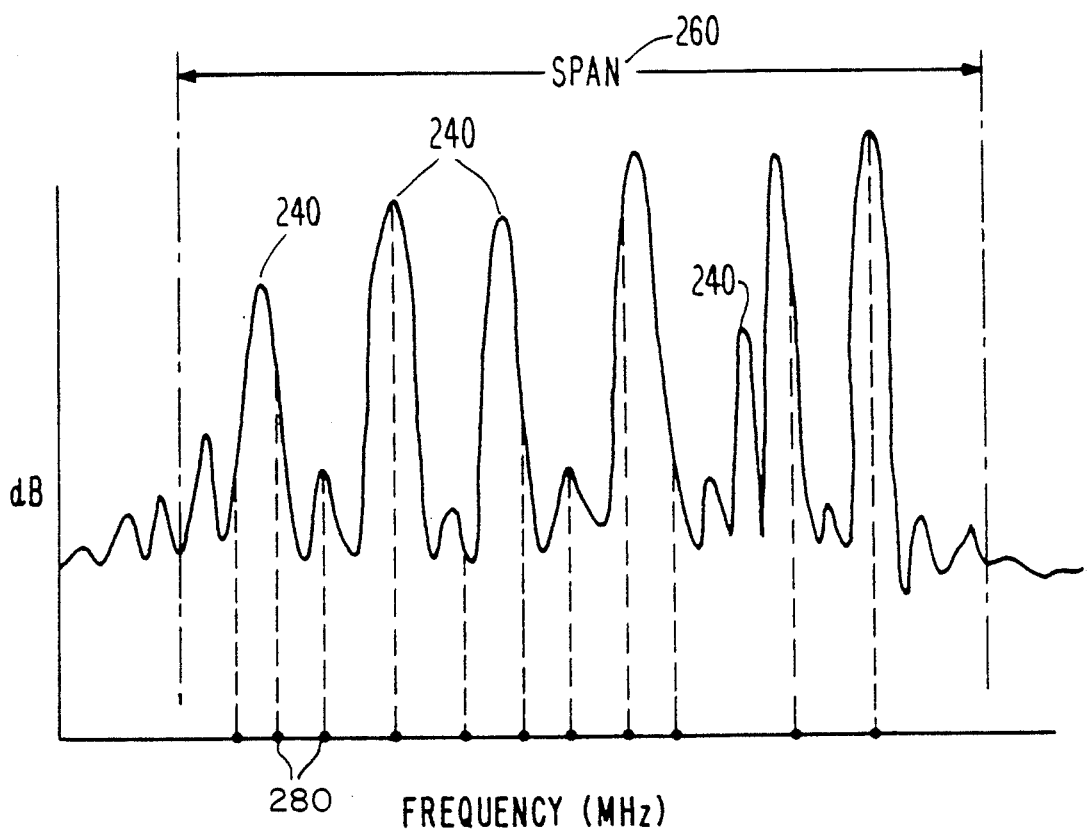
FIG. 2 is an exemplary frequency spectrum obtained from an analyzer in an EMI measurement system.

The present invention provides methods and apparatus to aid an operator in distinguishing between narrowband continuous signals and broadband and impulsive emissions during EMI measurements. The methods and systems provided in accordance with this invention distinguish narrowband continuous wave signals from broadband emissions or impulsive noise. One embodiment provides software which runs on Hewlett-Packard's HP series 200 or 300 desktop computers utilizing Hewlett-Packard's HP 85864D software package.

Referring now to the drawings wherein like reference numerals refer to like elements, FIGS. 1A-1B are a flow chart which describes a preferred embodiment of methods provided in accordance with this invention. It is desired to set up an EMI measuring receiver or spectrum analyzer to obtain a frequency spectrum of the broadband and narrowband signals at 20. In preferred embodiments, Hewlett-Packard's HP 8566B 100 Hz through 22 GHz or Hewlett-Packard's HP 8568B 100 Hz through 1,500 MHz spectrum analyzer may be used to obtain the desired frequency spectrum. The spectrum analyzer generally comprises a resolution bandpass filter which has a known response and resolution bandwidth (RBW). Since a noise-free, narrowband signal will trace out the response of a resolution bandpass filter, the filter's response may be used as a reference when discriminating between narrowband signals and broadband signals or impulsive noise. A template is generated at 40 to create a reference describing the attenuation function of the resolution bandpass filter. The template may then be approximated to a curve, preferably a second order polynomial, at 60 so that an approximation of the attenuation peak of the resolution bandpass filter may be obtained.

In preferred embodiments, a trace of the frequency spectrum received by the spectrum analyzer or measuring receiver is obtained at 80 in order to find those peaks in the spectrum which satisfy "peak criteria" and thus are potentially due to narrowband continuous wave signals in the spectrum. For each peak satisfying the peak criteria at 80, an integration step can be performed at 100 so that the peak's aspect ratio can be determined. The peak's aspect ratio is defined as the area of the peak divided by twice the deviation from the RBW filter center frequency. The peak's aspect ratio is compared with the aspect ratio of the resolution bandpass filter as approximated at 60 to initially determine if the peak is due to a narrowband continuous wave signal.

The two aspect ratios so determined are then compared at 120 to within a predetermined tolerance, $\epsilon$, such that if the aspect ratio for the signal is within $\epsilon$ of the bandpass filter, the signal is initially classified as a narrowband signal at 140. If the peak's aspect ratio is not within $\epsilon$, the signal is discarded from the frequency spectrum at 160 since it will be due to a broadband signal.

For each peak so initially classified as a narrowband signal, a second order polynomial is determined to approximate the shape of the peak at 180. A secondary determination may then be made to finally classify the peak in the spectrum as due to either a narrowband or broadband signal by comparing at 200 the bandwidth determined from the approximated peak with the resolution bandwidth determined from the second order approximation of the bandpass filter as a reference. This comparison is done to within a percentage difference $\epsilon'$ such that if the bandwidth of the approximated peak is not within $\pm\epsilon'$, the peak is labeled as being due to a broadband signal. Otherwise, the peak is finally classified as a narrowband signal at 220. Steps 100 through 220 are repeated for each peak determined at step 80 to initially meet the narrowband peak criteria.

Referring to FIG. 2, a typical trace graph of a signal from an EUT detected by an EMI measurement system is plotted with frequency on the X axis and intensity in dB on the Y axis. A spectrum analyzer or swept tuned receiver typically provides a trace of this nature. The various peaks 240 in the signal can be classified as narrowband or broadband signals by methods and systems provided in accordance with this invention.

Previously, a site operator would look at the analyzer's screen and manually classify the peaks 240 as either narrowband or broadband depending upon particular criteria. Typically, a broadband signal is defined as a signal which produces a frequency response having a bandwidth greater than the resolution bandwidth of the bandpass filter of the analyzer or swept tuned receiver. Similarly, a narrowband signal is defined as a signal that produces a frequency response having a bandwidth which does not exceed the frequency bandwidth of the resolution bandpass filter. Typically, a continuous wave signal has an infinitely narrow bandwidth and is referred to as a spectral line at frequency $f_o$. Such manual methods of determining whether a signal is broadband or narrowband are extremely tedious and time consuming, taking hours of an operator's time. Thus, these manual methods do not fulfill a long-felt need in the art for efficient and expedient methods to distinguish narrowband continuous wave signals from broadband or impulsive noise.

In accordance with preferred embodiments, a frequency span 260 is chosen such that the RBW to frequency span ratio is less than or equal to 75. This ensures that enough data points 280 are swept to accurately describe the bandpass filter's shape. In preferred embodiments, about 1000 data points are swept to ensure proper tracing of the bandpass filter's shape.

The bandpass filter's response can generally be described with a template following the form:

$$\Delta = n\ 10\ log_{10}[1+(2^{1/n}-1)\Omega^2]$$

wherein $\Delta$ is the attenuation from peak of the RBW filter. Furthermore, $$\Omega = \frac{K*(2\Delta\omega)}{RBW},$$

and n is the order of the filter.

Generally, K is a constant equal to 1 for a normal RBW filter and about 1.6 for an impulse bandwidth RBW filter. $\Delta\omega$ is the deviation from the filter center frequency.

Thus, the attenuation or shape of the bandpass filter can be described by the above template. However, in preferred embodiments, $\Delta$ may be approximated to a second order polynomial of the form:

$$\Delta = C_0 + C_1(\Delta\omega) + C_2(\Delta\omega)^2$$

The bandwidth for the filter bandwidth BW, may then be calculated from the second order approximation as:

$$BW = 2\sqrt{\Delta/C_2}.$$

Approximating the trace to a second order polynomial, an equivalent rectangular bandwidth for the resolution bandpass filter can be obtained.

Figure 3:
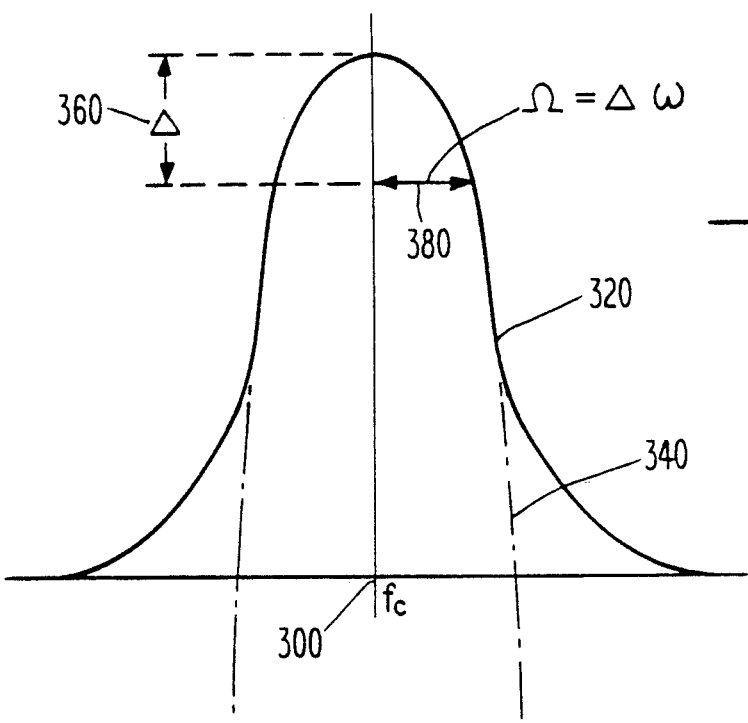
FIG. 3 is a curve for a synchronously tuned bandpass filter as compared to a parabolic approximation of the synchronously tuned bandpass filter.

FIG. 3 shows a graphical interpretation of $\Delta$ for the template and $\Delta$ for the second order approximation centered around the filter center frequency, $f_c$, at 300. The actual shape of the filter described by the template traces out a typical Gaussian distribution 320. The second order polynomial approximation of the RBW bandpass filter traces out a parabolic shape 340 which closely approximates the attenuation from the peak of the RBW filter, $\Delta$, at 360. The deviation from the center frequency, $\Delta\omega$, is shown generally at 380.

When the trace is read from the analyzer screen at step 80, a first pass is made through the frequency span to determine which of the discrete frequencies in the spectrum potentially define narrowband continuous peaks. This first pass through, for example, 1000 points in the frequency spectrum, compares each discrete frequency 280 shown in FIG. 2 with the two adjacent peaks to determine if a predetermined change between discrete frequencies exists, thereby indicating whether each discrete frequency potentially defines a peak from a narrowband continuous wave signal in the frequency spectrum.

Figure 4:
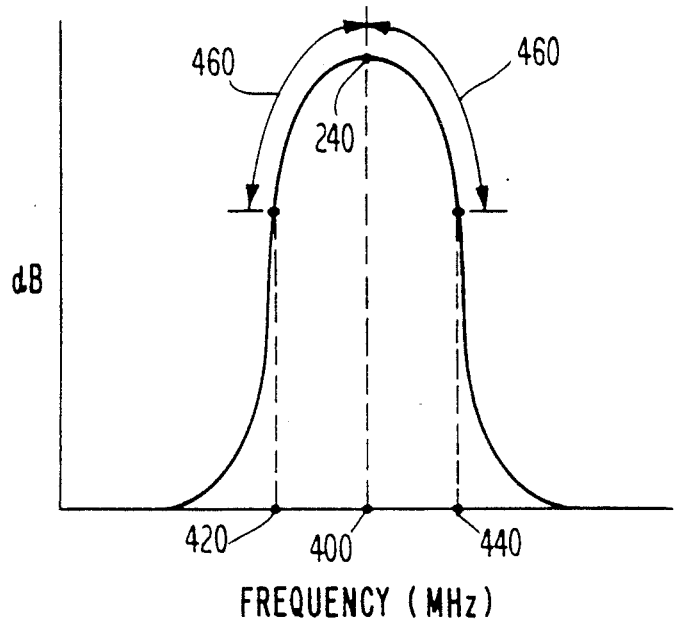
FIG. 4 shows a potential narrowband peak isolated from the spectrum measured in accordance with the flow chart shown in FIGS. 1A-1B.

Referring to FIG. 4 an exemplary peak 240 in the frequency spectrum is shown. By comparing discrete frequency 400 with its adjacent neighbors at 420 and 440, a determination can be made as to whether peak 240 is potentially from a narrowband continuous wave signal. If the changes along the Y-axis between discrete frequencies 400 and 420 and between discrete frequencies 400 and 440 are greater than a predetermined threshold, then it may be said that peak 240 is potentially due to a narrowband continuous wave signal. The changes are shown generally at 460. In preferred embodiments, if the predetermined change is 10 dB between discrete frequency 400 and 420 and discrete frequency 400 and 440, then the initial pass through the frequency spectrum classifies peak 240 as potentially from a narrowband continuous wave signal.

For each peak in the frequency spectrum found to be potentially due to a narrowband continuous wave signal, an initial determination is made as to whether the peak is from a narrowband continuous wave signal. The initial determination made at step 100 compares the "aspect ratio" of the peak with the aspect ratio for the second order approximation of the resolution bandpass filter. An aspect ratio may be calculated for a curve, G(f), by integrating the curve over a frequency range according to the following relationship:

$$\int_{f_c - \Delta\omega}^{f_c + \Delta\omega} G(f)df = A;$$

where A is the area under the curve. The area A is then divided by $2\Delta\omega$ which is defined as the aspect ratio for the curve such that:

$$\text{Aspect ratio} = \frac{A}{2\Delta\omega}$$

In this fashion the aspect ratio for the peak 240 and the aspect ratio of the resolution bandpass filter can then be calculated. A comparison of the two aspect ratios can be made to determine whether the peak 240 should initially be classified as a narrowband continuous wave signal. In preferred embodiments the comparison of the two aspect ratios is made such that:

$$1 - \epsilon < \frac{\text{Aspect ratio}_{peak}}{\text{Aspect ratio}_{filter}} < 1 + \epsilon$$

where $\epsilon$ is a predetermined tolerance. If the above equation is satisfied, the signal from peak 240 is initially classified as due to a narrowband continuous wave signal. Both $\Delta\omega$ and $\epsilon$ have predetermined values which are determined by the particular resolution bandpass filter in the analyzer or measuring receiver.

The aspect ratio test thus provides an initial determination of whether the peaks are from narrowband continuous wave signals. However, impulsive signals, which are generally not due to narrowband signals of the type desired to be identified in EMI measurements may pass the aspect ratio test since their integrated areas may satisfy the preceding equation. Thus, impulsive noise signals typically are initially classified as narrowband signals even though they are broadband signals of short duration. However, the aspect ratio test effectively eliminate broadband noise from the spectrum.

It is thus desirable to perform a second test on the remaining peaks in the spectrum which have passed the aspect ratio test to determine if they are indeed from narrowband continuous wave signals. In preferred embodiments, this second test is a curve fitting test performed at 180. For each peak which has passed the aspect ratio test, it is desired to approximate each of the peaks to a second order polynomial of the form similar to the second order polynomial approximation of the resolution bandpass filter attenuation peak, $\Delta$. The equivalent rectangular bandwidth for each peak can then be calculated such that:

$$BW_{peak} = 2\sqrt{\Delta/C_2}$$

The resolution bandwidth of the bandpass filter approximated by the second order polynomial and the equivalent bandwidth of the peak approximated by a second order polynomial can then be compared to within a percentage difference to secondarily determine whether the peak is indeed due to a narrowband continuous wave signal. The comparison is made according to the following relationship:

$$BW_{filter} + \epsilon' < BW_{peak} < BW_{filter} - \epsilon'$$

If the above relationship holds true, then the signal can be secondarily classified as a narrowband signal. Otherwise the peak is discarded from the spectrum. Peaks that pass the aspect ratio test but are due to impulsive noise signals fail the curve fitting test because they cannot be approximated to second order polynomial approximations, i.e., they do not fit the RBW shape.

In preferred embodiments, the polynomial curve fit is a least squares analysis. A second order polynomial provides an effective curve fit within 10 dB of the filter peak. Fourth order fits extend this range to 20 dB, but the computation time is quadrupled. Accordingly, the curve fit is preferably accomplished by following the standard least squares normal equations:

$$AC = Y.$$

where
Y is the vector of observations (measurements);
C is the coefficient vector; and
A is the the design matrix.
The design matrix can generally be characterized as:

$$\begin{matrix} 1 & X_1 & X_1^2 & \ldots & X_1^n \\ 1 & X_2 & X_2^2 & \ldots & X_2^n \\ \cdot & \cdot & \cdot & & \\ \cdot & \cdot & \cdot & & \\ \cdot & \cdot & \cdot & & \\ 1 & X_n & X_n^2 & \ldots & X_n^n \end{matrix}$$

The least squares analysis is accomplished when C is found such that $||AC - Y||_2$ is minimized. Solutions of the least squares equation thus exist when:

$$C = (A^T A)^{-1} A^T Y$$

In the second order polynomial curve fit, the coefficient $C_2$ can generally be considered a measure of the curvature while $C_0$ is a measure of the peak value.

For the polynomial curve fit, it is necessary to apply a decision criterion to determine if the bandwidth of the peak is within $\epsilon'$ of the bandwidth of the bandpass filter. In preferred embodiments, the bandwidth of the peak should be within 35% of the bandwidth of the filter in order for the peak to be verified as due to a narrowband continuous signal. The allowed 35% variation takes into account ±10% specified filter bandwidth error and allows for about 25% random modulation which may occur on the received signal. The tolerance for the filter error could be removed by obtaining an actual curve for the given RBW to frequency span ratio from the spectrum analyzer display. In this manner, rather than using the template as a reference, curve fitting data could be used as the reference.

Figure 5:
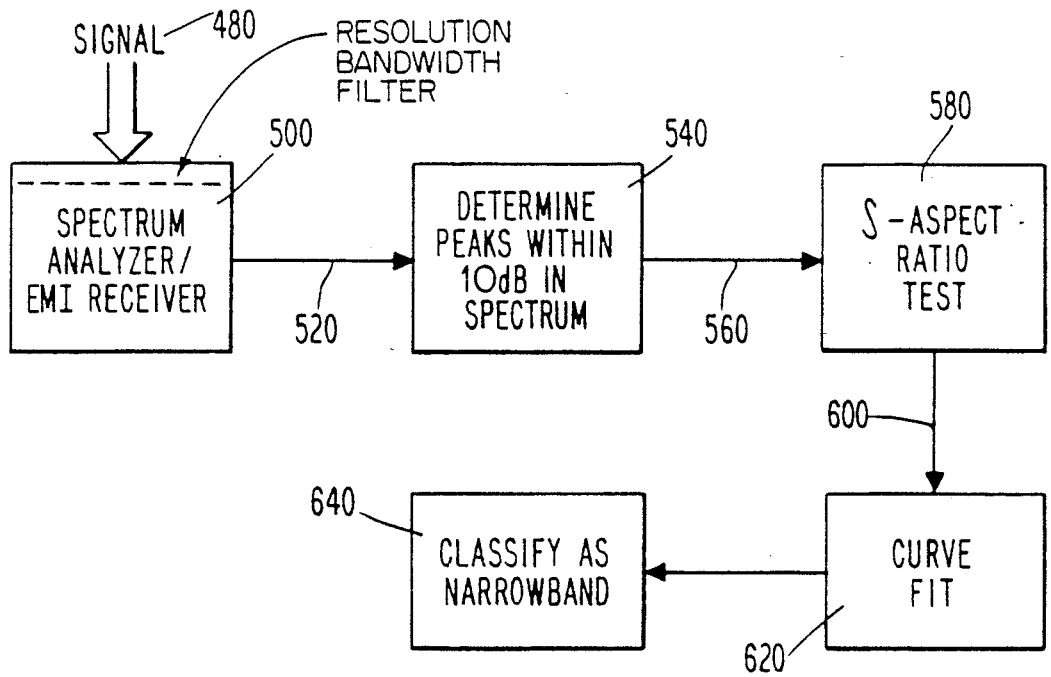
FIG. 5 is a system to distinguish narrowband continuous wave signals from broadband and impulsive signals.

Referring to FIG. 5, a system for distinguishing narrowband continuous wave signals from broadband and impulsive signals is shown. A signal 480 is input to a spectrum analyzer or EMI swept tuned receiver 500. The receiver analyzes the signal and obtains a frequency spectrum across a desired frequency span such that the RBW/frequency span is less than or equal to 75. This number depends upon the number of voltage measurements over the frequency span. The spectrum analyzer or measuring receiver input the frequency spectrum 520 to measurement means 540 for determining a discrete number of peaks in the frequency spectrum. The measurement means preferably samples about 1000 discrete frequencies to determine whether they exhibit a 10 dB change with respect to their adjacent neighbors. If a 10 dB change between discrete frequencies exists, then these discrete frequencies potentially define a narrowband continuous wave signal in the frequency spectrum.

Each peak so identified by measurement means 540 is fed via a bus 560 to integrator means 580 which performs an aspect ratio test to make an initial determination as to whether each of the peaks in the spectrum is from a narrowband continuous wave signal. Each peak initially determined to be from a narrowband continuous wave signal at 580 is fed via a bus 600 to curve fitting means 620.

The curve fitting means 620 determines a second order polynomial approximation for the resolution bandpass filter and a second order polynomial approximation for the peaks and compares the bandwidths to within a predetermined percentage difference to finally determine whether the peaks are due to narrowband continuous wave signals. Peaks which pass the aspect ratio test performed by integrator means 580 and the curve fitting test performed by curve fitting means 620 are classified 640 as narrowband continuous wave signals. This signal recognition method is particularly useful for MIL-STD-461-B shielded room EMI measurements.

It will be recognized by those with skill in the art that systems illustrated in FIG. 5 may be implemented on a digital microcomputer in hardware and firmware, or on any standard digital computer which can execute software to accomplish the steps described in the flow chart shown in FIGS. 1A-1B. Attached to the specification, and immediately preceding the claims is an exemplary computer program which may be executed by a microprocessor to carry out one embodiment of this invention.

There have thus bee described certain preferred embodiments of methods and apparatus for distinguishing narrowband continuous wave signals from broadband and impulsive signals. While preferred embodiments have been disclosed, it will be recognized by those with skill in the art that modifications ar within the true spirit and scope of the invention. The appended claims are intended to cover all such modifications.

```
10    ! This procedure is to investigate an algorithm for BB/NB discrimination
20       COM /Hpib/ @Sa,@Sa_bin
30       COM /Test_traces/ INTEGER Orig_tr(1:1001),Peak_pos(1:1001),Nb_peak_pos(1:1
40    ,Bb_tr(1:1001),Smooth_tr(1:1001),No_nb_peaks
40    !
50       ASSIGN @Sa TO 718
60       ASSIGN @Sa_bin TO 718;FORMAT OFF
70       ASSIGN @Presel TO 719
80    !
90    !---------------------DATA ACQUISTION---------------------
100   !
110   ! first dispose of all variables and traces
120      OUTPUT @Sa;"DISPOSE ALL;"
130   !
140   ! set analyzer up
150      Freq=5.000E+4
160      Ref_lvl=0.
170      Input$="I1"
180      Rbw=1.E+3
190      Span=75*Rbw
200      CALL Set_recvr(@Sa,@Presel,Input$,Freq,Rbw,Span,Ref_lvl)
210   !
220   ! define filter type- normal("NORM") or impulse("IMPULSE")
230      Filter_type$="IMPULSE"
```

```
240  !
250  ! set peak criteria
260    Peak_crit=13
270  !
280  ! find the peaks
290    CALL Get_pk_traces(@Sa,@Sa_bin,Peak_crit,Orig_tr(*),Smooth_tr(*),Peak_pos(*))
300  !
310  ! dispose of all variables and traces
320    OUTPUT @Sa;"DISPOSE ALL;"
330  !
340  !---------------------DATA PROCESSING---------------------
350  !
360  ! find the narrowband peaks
370    T1=TIMEDATE
380    CALL Find_nb_peaks(Filter_type$,Rbw,Span,Peak_crit,Orig_tr(*),Peak_pos(*),Nb_peak_pos(*),No_nb_peaks)
390  !
400    CALL Make_bb_trace(Filter_type$,Rbw,Span,Orig_tr(*),Bb_tr(*),Smooth_tr(*),Nb_peak_pos(*),No_nb_peaks)
410    T2=TIMEDATE
420    PRINT "Total processing time=",T2-T1
430  !
440  ! plot results
450    CALL Plot_trace_data(Orig_tr(*),Bb_tr(*),Peak_pos(*),Nb_peak_pos(*))
460  !
470    END
480  !
490  !******************************************************
500  !
510    DEF FNIntegrate_trace(INTEGER Trace_data(*),Y_ref,Start_pixel,Stop_pixel)
520  Integrate_trace:REM
530    !
540      INTEGER Integral
550    !
560      CALL Integrate_tr(Trace_data(*),Y_ref,Start_pixel,Stop_pixel,Integral)
570    !
580      RETURN Integral
590    !
600    FNEND
610  !
620  !******************************************************
630  !
640    SUB Get_pk_traces(@Sa,@Sa_bin,Peak_crit,INTEGER Traces(*),Smooth_tr(*),Peak_pos(*))
650  Get_pk_traces:REM
660    !
670    ! clr peak_pos(*)
680      MAT Peak_pos= (0)
690    !
700    ! this is req'd for proper operation of PEAKS routine
710      OUTPUT @Sa;"RL?;"
720      ENTER @Sa;Current_rl
730      OUTPUT @Sa;"TH";Current_rl-90;"DB;THE OFF;"
740    !
750    ! Define peaks array and initialize it
760      OUTPUT @Sa;"TRDEF PEAK_ARRAY; MOV PEAK_ARRAY,0;"
770    !
780    ! invoke PEAKS command
790      OUTPUT @Sa;"MKPX";Peak_crit;" PEAKS PEAK_ARRAY,TRA,FRQ;"
```

```
800   !
810   ! get peaks data
820     OUTPUT @Sa;"O2 PEAK_ARRAY?;"
830     ENTER @Sa_bin;Peak_pos(*)
840   !
850   ! get trace a data
860     OUTPUT @Sa;"O2 TA"
870     ENTER @Sa_bin;Tracea(*)
880   !
890   ! smooth tr-- will need this later to remove nb peaks
900     OUTPUT @Sa;"SMOOTH TRA 2;O2 TA;"
910     ENTER @Sa_bin;Smooth_tr(*)
920   !
930     OUTPUT @Sa;"DISPOSE ALL;"  ! release SA memory for PEAK_ARRAY
940   !
950   SUBEND                       ! get_pk_traces
960   !
970   !****************************************************************
980   !
990   SUB Compare_area(INTEGER Orig_tr(*),Peak_pos(*),Rbw_span,Rbw_peak,Nb_peak_
      pos(*),No_nb_peaks,REAL Norm_rbw_area)
1000  !
1010 Compare_area:REM
1020  !
1030    INTEGER Pk_element,Peak_loc,Signal_area,Pk_start,Pk_stop,Ref_ampl,Nb_pk
1040  !
1050    Nb_pk=1
1060    Pk_element=1
1070  !
1080    REPEAT
1090      Peak_loc=Peak_pos(Pk_element)
1100      Pk_start=MAX(Peak_loc-(Rbw_span/2),1)
1110      Pk_stop=MIN(Peak_loc+(Rbw_span/2),1001)
1120      Ref_ampl=Orig_tr(Pk_start)
1130      Delta=(Orig_tr(Peak_loc)-Ref_ampl)
1140      Signal_area=FNIntegrate_trace(Orig_tr(*),Ref_ampl,Pk_start,Pk_stop)
1150      IF Delta<>0 THEN
1160        Norm_sig_area=Signal_area/(Delta)
1170        Sig_rbw_ratio=Norm_sig_area/Norm_rbw_area
1180        IF (Sig_rbw_ratio>=.50) AND (Sig_rbw_ratio<=1.50) THEN
1190          Nb_peak_pos(Nb_pk)=Peak_loc
1200          Nb_pk=Nb_pk+1
1210        END IF
1220      END IF
1230      Pk_element=Pk_element+1
1240    UNTIL Peak_pos(Pk_element)=Peak_pos(Pk_element-1)
1250  !
1260    No_nb_peaks=Nb_pk
1270  !
1280  SUBEND
1290  !
1300  !****************************************************************
1310  !
1320  SUB Plot_trace_data(INTEGER Orig_tr(*),Bb_tr(*),Peak_pos(*),Nb_peak_pos(*))
1330 Plot_trace_data:REM
1340  !
1350    COM /Hpib/ @Sa,@Sa_bin
1360    INTEGER Start,Stop
```

```
1370    GINIT
1380  ! PLOTTER IS 705,"HPGL"
1390    VIEWPORT 0,RATIO*100,0,100
1400    Start=0
1410    Stop=1000
1420  !
1430    WINDOW Start,Stop,Start,Stop
1440    FRAME
1450    PEN 1
1460    LINE TYPE 1
1470  !
1480  ! Plot original trace
1490    PEN 4
1500    CALL Show_trace(Orig_tr(*),Start,Stop)
1510  !
1520  ! plot trace w/ nb peaks removed
1530    PEN 6
1540    CALL Show_trace(Bb_tr(*),Start,Stop)
1550  !
1560  ! show all the peaks
1570    PEN 3
1580  ! CALL Show_peaks(Orig_tr(*),Peak_pos(*))
1590  !
1600  ! indicate nb signals
1610    PEN 2
1620  ! CALL Show_peaks(Orig_tr(*),Nb_peak_pos(*))
1630  !
1640    SUBEND
1650  !
1660  !***********************************************************
1670  !
1680    DEF FNRbw_atten(Pk_offset,Rbw,Filter_type$)
1690    Rbw_atten:REM
1700  !
1710    INTEGER N
1720  !
1730    IF Rbw>=1.00E+5 THEN
1740      N=4
1750    ELSE
1760      N=5
1770    END IF
1780  !
1790    SELECT Filter_type$
1800    CASE "NORM"
1810      W=(2*Pk_offset)/Rbw
1820    CASE "IMPULSE"
1830      W=(3.2*Pk_offset)/Rbw
1840    END SELECT
1850  !
1860    W_sqd=W*W
1870    E=(2^(1/N))-1
1880    Atten_db=N*10*LGT(1+(E*W_sqd))
1890    Rbw_atten=INT((10*Atten_db)+.5)
1900  !
1910    RETURN Rbw_atten
1920  !
1930    FNEND
1940  !
1950  !***********************************************************
```

```
1960  !
1970  SUB Show_peaks(INTEGER Pk_trace(*),Peaks(*))
1980  Show_peaks:REM
1990  !
2000    INTEGER J
2010    J=1
2020    IF Peaks(1)<>0 THEN
2030      REPEAT
2040        MOVE Peaks(J),Pk_trace(Peaks(J))
2050        DRAW Peaks(J),0
2060        J=J+1
2070      UNTIL Peaks(J)=0 OR J=1001 OR Peaks(J)=Peaks(J-1)
2080    END IF
2090  !
2100  SUBEND
2110  !
2120  !***********************************************************
2130  !
2140  SUB Set_recvr(@Sa,@Presel,Input$,Freq,Rbw,Span,Ref_lvl)
2150  Set_recvr:REM
2160  !
2170    OUTPUT @Presel;Input$
2180    OUTPUT @Sa;"AUNITS DBM;RL ";Ref_lvl;"DM;AUNITS DBUV;CF ";Freq;"HZ;SP ";Span;"CONTS;RB ";Rbw
2190    OUTPUT @Presel;"COUPLE;"
2200    OUTPUT @Sa;"DET POS;SNGLS;TS;"
2210  !
2220  SUBEND
2230  !
2240  !***********************************************************
2250  !
2260  SUB Compare_curve(Peak_crit,Span,Rbw,X(*),Rbw_mask(*),INTEGER Rbw_span,Orig_tr(*),Nb_peak_pos(*),No_nb_peaks)
2270  Compare_curve:REM
2280  !
2290    DIM Coeff2(1:3),Design_matrx(1:101,1:3)
2300    INTEGER No_coeff,No_observ
2310  !
2320  ! determine 2nd order model of of ref. curve--the rbw filter response
2330  ! -----------------------------------------------------------
2340  ! construct design matrix
2350    No_coeff=3
2360    No_observ=Rbw_span+1
2370    CALL P_design_matrx(X(*),No_observ,No_coeff,Design_matrx(*))
2380  !
2390  ! compute second order poly curve fit coefficients
2400    CALL Norm_least_sq(Design_matrx(*),Rbw_mask(*),Coeff2(*),No_observ,No_coeff)
2410  !
2420  ! compute x-db BW of model for rbw filter
2430    Freq_res=Span/1000
2440    Model_bw=FNCompute_sig_bw(Coeff2(*),Peak_crit,Freq_res)
2450  !
2460  ! now compare peak models to rbw model in measured trace
2470  ! -----------------------------------------------------------
2480    CALL Compare_models(Peak_crit,Model_bw,Freq_res,Rbw_span,Orig_tr(*),Nb_peak_pos(*),No_nb_peaks)
2490  !
2500  SUBEND
2510  !
```

```
2520 !***************************************************************
2530 !
2540 SUB Norm_least_sq(A(*),Y(*),C(*),INTEGER No_observ,No_coeff)
2550 Norm_least_sq:REM
2560 !
2570   ALLOCATE A_t(1:No_coeff,1:No_observ),A_t_a(1:No_coeff,1:No_coeff)
2580   ALLOCATE A_t_y(1:No_coeff),A_t_a_inv(No_coeff,No_coeff)
2590   REDIM A(1:No_observ,1:No_coeff)
2600   REDIM Y(1:No_observ)
2610 !
2620 ! solve normal least sqs equations
2630   MAT A_t= TRN(A)
2640   MAT A_t_a= A_t*A
2650   MAT A_t_y= A_t*Y
2660   MAT A_t_a_inv= INV(A_t_a)
2670   MAT C= A_t_a_inv*A_t_y
2680 !
2690 SUBEND
2700 !
2710 !***************************************************************
2720 !
2730 DEF FNCompute_sig_bw(Coeff2(*),Delta_db,Resolution)
2740 Compute_sig_bw:REM
2750 !
2760   Delta_db_du=Delta_db*10
2770   IF Coeff2(3)<>0 THEN Bw=(Delta_db_du)/ABS(Coeff2(3))
2780   Bw=2*SQRT(Bw)*Resolution
2790   RETURN Bw
2800 !
2810 FNEND
2820 !
2830 !***************************************************************
2840 !
2850 SUB Integrate_rbw(Rbw_mask(*),INTEGER Rbw_peak,Rbw_span,REAL Norm_rbw_area)
2870 !
2880   INTEGER Pk_start,Pk_stop,Ref_ampl,Rbw_model(1:101)
2890 !
2900 ! convert rbw_mask to an integer data
2910   FOR I=1 TO Rbw_span+1
2920     Rbw_model(I)=INT(Rbw_mask(I))
2930   NEXT I
2940 !
2950   Pk_start=1
2960   Pk_stop=Pk_start+Rbw_span
2970   Ref_ampl=Rbw_mask(1)
2980   Delta=Rbw_peak-Ref_ampl
2990 !
3000 ! now integrate
3010   Rbw_area=FNIntegrate_trace(Rbw_model(*),Ref_ampl,Pk_start,Pk_stop)
3020 !
3030 ! normalize w.r.t. signal peak
3040   Norm_rbw_area=Rbw_area/Delta
3050 !
3060 SUBEND
3070 !
3080 !***************************************************************
3090 !
3100 SUB Make_rbw_data(X(*),Rbw,Span,Filter_type$,INTEGER Rbw_peak,Rbw_span,REAL Rbw_mask(*))
```

```
3110 Make_rbw_data:REM
3120    INTEGER Element
3130  !
3140    Delta_f=Span/1000
3150    Element=1
3160    Freq_offset=-(Rbw_span/2)+Delta_f
3170    Rbw_peak=1000
3180    REPEAT
3190      Rbw_mask(Element)=Rbw_peak-FNRbw_atten(Freq_offset,Rbw,Filter_type$)
3200      X(Element)=Element-((Rbw_span/2)+1)
3210      Element=Element+1
3220      Freq_offset=Freq_offset+Delta_f
3230    UNTIL Element=Rbw_span+2
3240  !
3250  SUBEND
3260  !
3270  !****************************************************************
3280  !
3290  DEF FNGet_sig_span(Filter_type$,Rbw,Span,Pk_delta)
3300  Get_sig_span:REM
3310  !
3320    Freq_res=Span/1000
3330  !
3340    IF Rbw<1.00E+5 THEN
3350      N=5
3360    ELSE
3370      N=4
3380    END IF
3390  !
3400    IF Filter_type$="IMPULSE" THEN
3410      K=1.6
3420    ELSE
3430      K=1
3440    END IF
3450  !
3460    Top=(10^(Pk_delta/(10*N)))-1
3470    Bottom=(2^(1/N))-1
3480    Omega=(SQRT(Top/Bottom))
3490    Bw=(Omega*Rbw)/(2*K)
3500    Rbw_span=2*INT((Bw/Freq_res)+.5)
3510  !
3520    RETURN Rbw_span
3530  !
3540  FNEND
3550  !
3560  !****************************************************************
3570  !
3580  SUB Compare_models(Peak_crit,Model_bw,Freq_res,INTEGER Rbw_span,Orig_tr(*)
,Nb_peak_pos(*),No_nb_peaks)
3590  Compare_models:REM
3600  !
3610    REAL Design_matrx(1:101,1:3),X(1:101),Sig_model(1:101),Coeff2(1:3)
3620  !
3630    INTEGER No_observ,No_coeff,Temp_pk_loc(1:1001),Real_nb_pk,Tr_element
3640    INTEGER Curve_fit,Intercept_fit,Sig_data,Pk_start,Pk_stop,Element
3650  !
3660    MAT Temp_pk_loc= (0)
3670    Tolerance=.25*Model_bw
3680    Y_deviation=50
3690    No_coeff=3
```

```
3700    Real_nb_pk=1
3710    Pk=1
3720    !
3730    REPEAT
3740    !
3750      Nb_pk_loc=Nb_peak_pos(Pk)
3760      Pk_start=MAX(Nb_pk_loc-(Rbw_span/2),1)
3770      Pk_stop=MIN(Nb_pk_loc+(Rbw_span/2),1001)
3780    !
3790    ! construct observation and measured data vectors
3800      CALL Make_curve_data(Pk_start,Pk_stop,Element,Rbw_span,Sig_model(*),X(
*),Orig_tr(*))
3810      No_observ=Element-1
3820    !
3830    ! compute second order model of signal
3840      CALL P_design_matrx(X(*),No_observ,No_coeff,Design_matrx(*))
3850      CALL Norm_least_sq(Design_matrx(*),Sig_model(*),Coeff2(*),No_observ,No
_coeff)
3860    !
3870    ! determine x-dB ( x=peak_crit ) BW of model for signal
3880      Sig_model_bw=FNCompute_sig_bw(Coeff2(*),Peak_crit,Freq_res)
3890    !
3900    ! Compare signal model parameters w/ ref. model parameters,
3910    ! if they matchto within allowed tolerance, then sig is bb:
3920      IF Coeff2(3)<0 THEN
3930        Curve_fit=ABS(Sig_model_bw-Model_bw)<Tolerance
3940        Intercept_fit=ABS(Orig_tr(Nb_pk_loc)-Coeff2(1))<Y_deviation
3950        IF Curve_fit AND Intercept_fit THEN
3960          Temp_pk_loc(Real_nb_pk)=Nb_pk_loc
3970          Real_nb_pk=Real_nb_pk+1
3980        END IF
3990      END IF
4000    !
4010      Pk=Pk+1
4020    UNTIL Pk=No_nb_peaks
4030    !
4040    MAT Nb_peak_pos= Temp_pk_loc
4050    No_nb_peaks=Real_nb_pk-1
4060    !
4070    SUBEND
4080    !
4090    !************************************************************
4100    !
4110    SUB Find_nb_peaks(Filter_type$,Rbw,Span,Peak_crit,INTEGER Orig_tr(*),Peak_
pos(*),Nb_peak_pos(*),No_nb_peaks)
4120 Find_nb_peaks:REM
4130    !
4140      INTEGER Rbw_area,Rbw_span,Rbw_peak
4150      DIM X(1:101),Rbw_mask(1:101)
4160    !
4170    ! get rbw mask for signal comparison
4180      Rbw_span=FNGet_sig_span(Filter_type$,Rbw,Span,Peak_crit)
4190      CALL Make_rbw_data(X(*),Rbw,Span,Filter_type$,Rbw_peak,Rbw_span,Rbw_mask
(*))
4200    !
4210    ! integrate rbw mask over peak excursion
4220      CALL Integrate_rbw(Rbw_mask(*),Rbw_peak,Rbw_span,Norm_rbw_area)
4230    !
4240      IF Peak_pos(1)<>0 THEN ! peaks present in trace
4250      !
```

```
4260 ! identify nb peaks
4270     CALL Compare_area(Orig_tr(*),Peak_pos(*),Rbw_span,Rbw_peak,Nb_peak_pos
(*),No_nb_peaks,Norm_rbw_area)
4280     CALL Compare_curve(Peak_crit,Span,Rbw,X(*),Rbw_mask(*),Rbw_span,Orig_t
r(*),Nb_peak_pos(*),No_nb_peaks)
4290 !
4300     END IF    ! peaks present in trace
4310 !
4320 SUBEND
4330 !
4340 !*************************************************************************
4350 !
4360 SUB Make_bb_trace(Filter_type$,Rbw,Span,INTEGER Orig_tr(*),Bb_tr(*),Smooth
_tr(*),Nb_peak_pos(*),No_nb_peaks)
4370 Make_bb_trace:REM
4380 !
4390     INTEGER Rbw_span,Rbw_model(1:501),Rbw_peak,Deviation,Rbw_pk_loc
4400     REAL X(1:501),Real_rbw(1:501)
4410 !
4420 ! Copy orig_tr into bb_tr
4430     MAT Bb_tr= Orig_tr
4440 !
4450 ! now, generate rbw_model w/ 70dB of snr
4460     Snr=70
4470     Rbw_span=FNGet_sig_span(Filter_type$,Rbw,Span,Snr)
4480     CALL Make_rbw_data(X(*),Rbw,Span,Filter_type$,Rbw_peak,Rbw_span,Real_rbw
(*))
4490 !
4500 ! Convert real_rbw(real array) to rbw_model(integer array)
4510     FOR I=1 TO 501
4520       Rbw_model(I)=INT(Real_rbw(I))
4530     NEXT I
4540 !
4550 ! now use rbw model to remove nb peaks that have been identified
4560     Deviation=100
4570     MAT SEARCH Rbw_model,LOC MAX;Rbw_pk_loc
4580     CALL Remove_nb_peaks(Rbw_model(*),Smooth_tr(*),Bb_tr(*),Nb_peak_pos(*),R
bw_pk_loc,No_nb_peaks,Deviation)
4590 !
4600 SUBEND
4610 !
4620 !*************************************************************************
4630 !
4640 SUB Show_trace(INTEGER Sig_tr(*),Start,Stop)
4650 Show_trace:REM
4660 !
4670     INTEGER I,J,Pen_control
4680 !
4690     MOVE 0,0
4700     J=1
4710     FOR I=Start TO Stop
4720       IF J>2 THEN
4730         IF (Sig_tr(J)=0) OR (Sig_tr(J-1)=0) THEN
4740           Pen_control=-2
4750         ELSE
4760           Pen_control=-1
4770         END IF
4780       END IF
4790       PLOT I,Sig_tr(J),Pen_control
4800       IF J<=1000 THEN J=J+1
```

```
4810      NEXT I
4820   !
4830      SUBEND
4840   !
4850   !***********************************************************
4860   !
4870   !
4880      CSUB Make_curve_data(INTEGER Pk_start,Pk_stop,Element,Rbw_span,REAL Sig_mo
del(*),X(*),INTEGER Orig_tr(*))
4890      CSUB Integrate_tr(INTEGER Trace_data(*),Y_ref,Start_pixel,Stop_pixel,Integ
ral)
4900      CSUB P_design_matrx(X_data(*),INTEGER No_observ,No_coeff,REAL Design_matrx
(*))
4910      CSUB Remove_nb_peaks(INTEGER Rbw_model(*),Smooth_tr(*),Bb_tr(*),Nb_peak_po
s(*),Rbw_peak,No_nb_peaks,Deviation)
```

What is claimed is:

1. A method of distinguishing narrowband continuous wave signals from broadband and impulsive signals, the narrowband continuous wave signals having a stable frequency spectrum over a predetermined frequency span derived from a resolution bandpass filter, the frequency span having a plurality of discrete frequencies, comprising the steps of:

providing an electromagnetic signal receiver means comprising a resolution bandpass filter having a resolution bandwidth;

capturing signals comprising the frequency spectrum over the predetermined frequency span by generating an electrical signal and driving the resolution bandpass filter to sweep the resolution bandpass filter across the frequency span and analyzing signals passed by the resolution bandpass filter;

detecting peaks of the signals comprising the frequency spectrum;

integrating each detected peak to determine which of the peaks are indicated to be from narrowband continuous wave signals; and discarding those peaks from the frequency spectrum indicated not to be from narrowband continuous wave signals.

2. The method recited in claim 1 further comprising the step of subsequently fitting non-discarded peaks to a predetermined curve to finally determine those peaks that are from narrowband continuous wave signals.

3. The method recited in claim 2 further comprising the step of ascertaining which discrete frequencies correspond to peaks that are from narrowband continuous wave signals in the measured frequency spectrum after those peaks are labeled.

4. The method recited in claim 3 wherein the ascertaining step comprises comparing each discrete frequency in the predetermined frequency span to its adjacent neighbors to determine each frequency which exhibits a predetermined change from its adjacent neighbors thereby defining the peaks in the frequency spectrum.

5. The method recited in claim 4 wherein there are approximately 1000 discrete frequencies in the predetermined frequency span.

6. The method recited in claim 5 wherein the predetermined change is approximately 10 dB.

7. The method recited in claim 6 wherein the integrating step comprises:

determining the area under each peak to obtain an equivalent rectangular bandwidth for each peak;

comparing each equivalent rectangular bandwidth for each peak to a predetermined bandwidth; and wherein the discarding step comprises:

eliminating each peak from the frequency spectrum having an equivalent rectangular bandwidth greater than the predetermined bandwidth.

8. The method recited in claim 7 wherein the predetermined bandwidth corresponds to the resolution bandwidth of the resolution bandpass filter.

9. The method recited in claim 8 wherein the ascertaining step is carried out over a predetermined frequency span that allows the measured frequency spectrum to describe a shape associated with the resolution bandpass filter.

10. The method recited in claim 9 wherein a ratio of the predetermined frequency span to resolution bandwidth of the resolution bandpass filter is chosen not to exceed 75.

11. The method recited in claim 10 wherein the fitting step comprises:

approximating a response of the resolution bandpass filter as a reference;

determining a resolution bandwidth of the resolution bandpass filter response reference;

approximating a shape for each peak indicated to be from narrowband continuous wave signals;

determining a bandwidth for each approximated peak; and comparing the bandwidth for each approximated peak to the resolution bandwidth of the resolution bandpass filter response reference to determine if each peak indicated to be from narrowband continuous wave signals is from a narrowband continuous wave signal.

12. The method recited in claim 11 wherein the approximation of the response of the resolution bandpass filter is a second order polynomial of the form:

$$\Delta = C_0 + C_1(\Delta\omega) + C_2(\Delta\omega)^2,$$

wherein $\Delta$ is the approximation of the response of the resolution bandpass filter, $C_0$, $C_1$, and $C_2$ are weighting coefficients calculated from the detected peaks with $C_2$ being a measure of the curvature of the shape of the resolution bandpass filter, and $\Delta\omega$ is the deviation from the center frequency of the resolution bandpass filter.

13. The method recited in claim 12 wherein the resolution bandwidth of the resolution bandpass filter response reference is determined by the following relationship:

$$BW = 2\sqrt{(\Delta)/C_2};$$

wherein

BW is the bandwidth of the resolution bandpass filter.

14. The method recited in claim 13 wherein the approximated shape for each peak indicated to be from narrowband continuous wave signals is a second order polynomial.

15. The method recited in claim 14 wherein the step of comparing the bandwidth for each approximated peak to the resolution bandwidth of the resolution bandpass filter response reference to determine if each peak indicated to be from narrowband continuous wave signals is from a narrowband continuous wave signal further comprises calculating a predetermined percentage difference that the resolution bandwidth of the resolution bandpass filter differs from the bandwidth for each approximated peak.

16. The method recited in claim 15 wherein the predetermined percentage difference is correlated to a given resolution bandpass filter bandwidth error and a given level of random signal modulation.

17. The method recited in claim 16 wherein the predetermined percentage difference is approximately 35%.

18. A system for distinguishing narrowband continuous wave signals from broadband and impulsive signals, comprising:

electromagnetic signal receiver means comprising a resolution bandpass filter and means for generating an electrical signal and connected to the resolution bandpass filter for driving the resolution bandpass filter to sweep the resolution bandpass filter across a predetermined frequency span for obtaining a frequency spectrum passed by the resolution bandpass filter containing narrowband continuous wave and broadband and impulsive signals;

means connected to the resolution bandpass filter for capturing signals comprising the frequency spectrum;

means connected to the signal capturing means for detecting peaks of the signals of the frequency spectrum; and integrator means connected to the peak detecting means for determining whether the peaks in the frequency spectrum initially correspond to narrowband continuous wave signals.

19. The system recited in claim 18 further comprising curve fitting means operatively coupled to the integrator means for fitting the peaks initially corresponding to narrowband continuous wave signals to a curve to determine which of the peaks in the frequency spectrum are from narrowband continuous wave signals.

20. The system recited in claim 19 wherein the peak detecting means comprises measurement means operatively coupled between the electromagnetic signal receiver means and the integrator means for determining the magnitude of a discrete number of peaks in the frequency spectrum.

21. The system recited in claim 18 wherein a ratio of the predetermined frequency span to resolution bandwidth of the resolution bandpass filter does not exceed 75.

22. The system recited in claim 20 wherein a ratio of the predetermined frequency span to resolution bandwidth of the resolution bandpass filter does not exceed 75.

23. The system recited in claim 22 wherein the predetermined frequency span comprises approximately 1000 discrete frequencies.

24. The system recited in claim 23 wherein the measurement means compares each discrete frequency with its adjacent neighbors to determine whether each discrete frequency exhibits a predetermined change, thereby defining the discrete number of peaks in the frequency spectrum.

25. The system recited in claim 24 wherein the predetermined change is approximately 10 dB.

26. The system recited in claim 25 wherein the integrator means determines an equivalent rectangular bandwidth for each peak and compares the equivalent rectangular bandwidth for each peak to the resolution bandwidth of the resolution bandpass filter.

27. The system recited in claim 26 wherein the curve fitting means generates a second order polynomial approximation for the resolution bandwidth of the resolution bandpass filter and a second order polynomial approximation for the bandwidth of each of the peaks, and wherein the curve fitting means comprises means for calculating a percentage difference between the approximation of the bandwidth of each of the peaks and the approximation of the resolution bandwidth for the resolution bandpass filter.

28. The system recited in claim 27 wherein the percentage difference is less than approximately 35% for narrowband continuous wave signals.

29. A method of pattern recognition of a continuous wave and frequency stable signal intermixed with broadband and impulsive signals, comprising the steps of:

providing an electromagnetic signal receiver means comprising a resolution bandpass filter having a resolution bandwidth;

obtaining a frequency spectrum of the signals over a frequency span having a plurality of discrete frequencies by generating an electrical signal and driving the resolution bandpass filter to sweep the resolution bandpass filter across the frequency span and analyzing signals passed by the resolution bandpass filter;

comparing each discrete frequency with its adjacent neighbors to determine which discrete frequencies exhibit a predetermined change with respect to their adjacent neighbors, thereby defining a discrete number of peaks in the frequency spectrum;

integrating each peak over its bandwidth to determine the peak's area and equivalent rectangular bandwidth;

discarding each peak from the frequency spectrum that has an equivalent rectangular bandwidth greater than a minimum rectangular bandwidth;

fitting the non-discarded peaks to a predetermined curve;

labeling the non-discarded peaks from the frequency spectrum which do not fit the predetermined curve as broadband; and recognizing the non-discarded peaks from the frequency spectrum which fit the predetermined curve as narrowband continuous wave signals.

30. The method recited in claim 29 wherein there are 1000 discrete frequencies in the frequency span.

31. The method recited in claim 30 wherein the predetermined change is 10 dB.

32. The method recited in claim 31 wherein the fitting step further comprises approximating the non-discarded peaks to a second order polynomial and determining a percentage difference between the equivalent rectangular bandwidth and an equivalent bandwidth associated with the predetermined curve.

33. The method recited in claim 32 wherein the predetermined curve is a second order polynomial curve.

34. The method recited in claim 33 wherein the percentage difference is less than approximately 35%.

* * * * *